US012580579B2

(12) United States Patent
Han et al.

(10) Patent No.: US 12,580,579 B2
(45) Date of Patent: Mar. 17, 2026

(54) VOLTAGE REGULATOR WITH PROGRAMMABLE TELEMETRY CONFIGURATION

(71) Applicant: Advanced Micro Devices, Inc., Santa Clara, CA (US)

(72) Inventors: Wei Han, Shangahi (CN); Meeta Surendramohan Srivastav, Austin, TX (US); Lili Chen, Shanghai (CN); Indrani Paul, Austin, TX (US)

(73) Assignee: Advanced Micro Device, Inc., Santa Clara, CA (US)

( * ) Notice: Subject to any disclaimer, the term of this patent is extended or adjusted under 35 U.S.C. 154(b) by 200 days.

(21) Appl. No.: 18/478,892

(22) Filed: Sep. 29, 2023

(65) Prior Publication Data

US 2025/0112639 A1 Apr. 3, 2025

(51) Int. Cl.
| | |
|---|---|
| *H03M 1/36* | (2006.01) |
| *H03M 1/16* | (2006.01) |
| *H04Q 9/00* | (2006.01) |
| *H02M 1/00* | (2006.01) |
| *H02M 3/158* | (2006.01) |

(52) U.S. Cl.
CPC ............... *H03M 1/36* (2013.01); *H03M 1/16* (2013.01); *H04Q 9/00* (2013.01); *H02M 1/00* (2013.01); *H02M 3/158* (2013.01)

(58) Field of Classification Search
CPC ............ H03M 1/36; H03M 1/16; H04Q 9/00; H02M 1/00; H02M 3/158
See application file for complete search history.

(56) References Cited

U.S. PATENT DOCUMENTS

| | | | | |
|---|---|---|---|---|
| 10,224,812 B1 * | 3/2019 | Sen | ........................ | H02M 3/157 |
| 2019/0069154 A1 * | 2/2019 | Booth | ..................... | H04W 4/90 |
| 2022/0091661 A1 * | 3/2022 | McAfee | .................. | H02M 1/36 |

* cited by examiner

*Primary Examiner* — Joseph J Lauture
(74) *Attorney, Agent, or Firm* — Greenberg Traurig, LLP

(57) ABSTRACT

An apparatus can include: a processor; a voltage regulator configured to provide a processor voltage and a processor current to the processor; and a voltage regulator controller that can include a current sensor comprising an analog-to-digital converter (ADC) having an ADC input range and configured to provide current data based on an ADC input voltage, and a configuration manager configured to receive processor power data and adjust the ADC input range based on the processor power data. Various other methods, systems, and computer-readable media are also disclosed.

20 Claims, 10 Drawing Sheets

200

500

520

800

900

Start

Set scale parameter of ADC
902

Measure processor current using ADC
904

Transmit processor current to processor
906

Receive signal indicating change in processor power
908

Adjust scale parameter of ADC based on the change in processor power
910

End

1000

VOLTAGE REGULATOR WITH PROGRAMMABLE TELEMETRY CONFIGURATION

BACKGROUND

A processor such as a CPU (central processor unit), GPU (graphics processor unit) or APU (accelerated processor unit) can be powered by one or more power sources. It can be advantageous to accurately monitor the processor current supplied to the processor by the one or more power supplies.

SUMMARY

As will be described in greater detail below, the present disclosure describes various apparatus and methods for controlling a voltage regulator. In some examples, an apparatus can include a processor; a voltage regulator configured to provide a processor voltage to the processor; and a voltage regulator controller comprising a current sensor comprising an analog-to-digital converter (ADC) having an ADC input range and configured to provide current data based on an ADC input voltage, and a configuration manager configured to receive processor power data and adjust the ADC input range based on the processor power data. The voltage regulator controller can further include: a telemetry manager configured to receive the current data from the ADC and to transmit current and/or voltage data to the processor.

The configuration manager can be configured to receive processor power data from the processor. The ADC can have an ADC input range offset and the configuration manager can be configured to adjust the ADC input range offset based on the processor power data. The ADC can have an ADC input represented by between 8 and 12 bits. The ADC can have an ADC input range offset and the configuration manager can be configured to adjust the ADC input range offset based on the processor power data.

The configuration manager can be configured to receive processor power data from the processor. The ADC can have an ADC input range offset and the configuration manager can be configured to adjust the ADC input range offset based on the processor power data. The ADC can have an ADC input represented by between 8 and 12 bits. The ADC can have an ADC input range offset and the configuration manager can be configured to adjust the ADC input range offset based on the processor power data.

In some examples, the processor can have a low power mode and a high power mode, the ADC input range can have a lower value when the processor operates in the low power mode, and the ADC input range can have a higher value when the processor operates in the high power mode. In some examples, the processor can have a plurality of operational modes including a low power mode and a high power mode, and the processor power data includes a low power indication when the processor operates in the low power mode. A least significant bit of the ADC can represent a voltage of less than a first voltage when the processor operates in the low power mode, the least significant bit of the ADC can represent a voltage of greater than a second voltage when the processor operates in a high-power mode, where the second voltage can be at least 50% greater than the first voltage.

In some examples, the voltage regulator controller can improve the power telemetry accuracy of the apparatus, particularly when the processor is in the low power mode.

The apparatus can be or include a computer device, and the processor can be a central processor unit (CPU), a graphics processor unit (GPU), or an accelerated processor unit (APU). In some examples, the processor can have a multiphase power supply, the voltage regulator can include a plurality of phase current sensors, each phase current sensor of the plurality of phase current sensors can include a respective ADC providing a phase current to a current summer, and the current summer can provide a summed current, for example, to the telemetry manager.

In some examples, an example method can be encoded as computer-readable instructions on a non-transitory computer-readable medium. For example, a computer-readable medium can include one or more computer-executable instructions that, when executed by at least one processor of a computing device, can cause the computing device to perform a method such as described herein.

In some examples, a computer-implemented method for controlling a voltage regulator, at least a portion of the method being performed by a computing device comprising at least one processor, includes setting a scale parameter for an analog-to-digital converter (ADC) to an initial scale parameter, measuring a processor current for a processor using the ADC, and transmitting the processor power to the processor. An example computer-implemented method may further include receiving a processor power signal indicating a change in the processor power, and adjusting the scale parameter to a second scale parameter based on the change in the processor power. A second processor current can be measured using the ADC and the second scale parameter, and the second processor current can be transmitted to the processor. The initial scale parameter can be an initial current per least significant bit of the ADC, and the second scale parameter can be a second current per least significant bit of the ADC. In some examples, a processor power signal indicating the change in the processor power can indicate a low power operation of the processor.

In some examples, a non-transitory computer-readable medium can include one or more computer-executable instructions that, when executed by at least one processor of a computing device, cause the computing device to receive a signal indicating low power operation of a processor, adjust a scale parameter of an analog-to-digital converter (ADC) to a low power scale parameter, measure processor current data using the ADC based on the low power scale parameter, and transmit the processor current data to the processor. The one or more computer-executable instructions, when executed by at the least one processor of the computing device, may further cause the computing device to receive a signal indicating a change in an operational power of the processor, and adjust the scale parameter of the analog-to-digital converter based on the change in the operational power of the processor.

Features from any of the embodiments described herein can be used in combination with one another in accordance with the general principles described herein. These and other embodiments, features, and advantages will be more fully understood upon reading the following detailed description in conjunction with the accompanying drawings and claims.

BRIEF DESCRIPTION OF THE DRAWINGS

The accompanying drawings illustrate a number of example embodiments and are a part of the specification. Together with the following description, these drawings demonstrate and explain various principles of the present disclosure.

Figure 1:
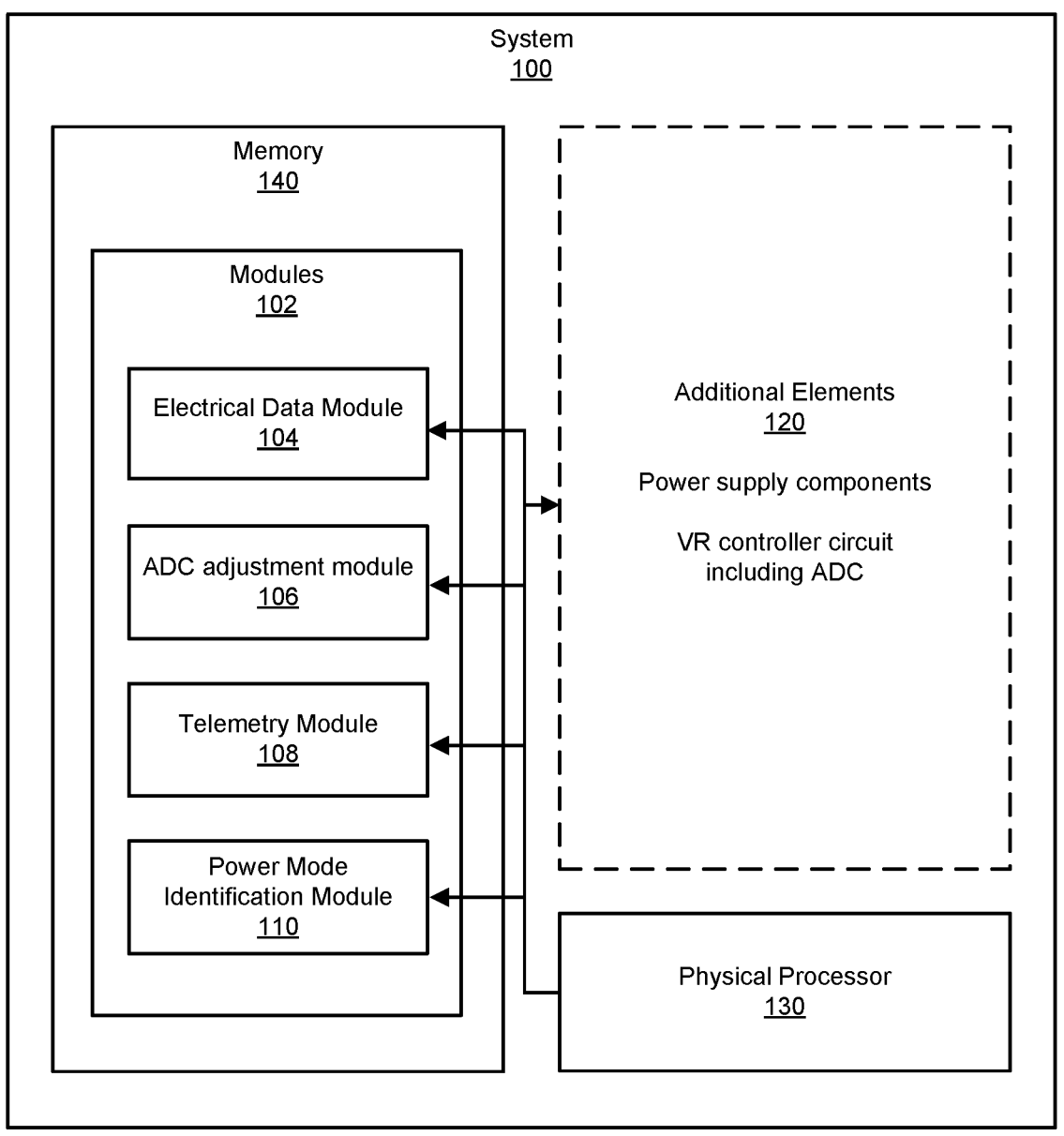
FIG. 1 is a block diagram of an example system that can include control of a voltage regulator, according to some examples.

Throughout the drawings, identical reference characters and descriptions indicate similar, but not necessarily identical, elements. While the example embodiments described herein are susceptible to various modifications and alternative forms, specific embodiments have been shown by way of example in the drawings and will be described in detail herein. However, the example embodiments described herein are not intended to be limited to the particular forms disclosed. Rather, the present disclosure covers all modifications, equivalents, and alternatives falling within the scope of the appended claims.

DETAILED DESCRIPTION OF EXAMPLE IMPLEMENTATIONS

The present disclosure is generally directed to systems and methods for controlling a voltage regulator. The following will provide, with reference to FIGS. 1-11, detailed descriptions of example systems and corresponding computer-implemented methods for control of a voltage regulator.

FIG. 1 is a block diagram of an example system 100. Example system 100 can include one or more modules 102 for performing one or more tasks. In this context, modules 102 may include one or more software modules configured to receive suitable data and determine, for example, electrical parameters of the circuit. As will be explained in greater detail below, modules 102 can include modules such as an electrical data module 104, an ADC adjustment module 106, a telemetry module 108, and a power mode identification module 110.

Although illustrated as separate elements, one or more of modules 102 in FIG. 1 can represent software modules receiving data from one or more circuits. For example, the electrical data module 104 may receive electrical data signals based on one or more processor electrical parameters (e.g., one or more of processor power, processor current, or processor voltage). In some examples, the electrical data signals may be based on the output of one or more ADCs, as discussed in more detail below, and the electrical data module 104 may receive the electrical data and determine, for example, the processor current. The power mode identification module 110 may receive processor power data related to the processor power (e.g., power consumption of the processor), and in some examples the processor power data may be provided by the processor. For example, a low processor power signal may be received from a processor operating in a low power mode. The ADC adjustment module 106 may adjust one or more scale parameters of one or more ADCs based on the processor power data, for example, by adjusting scale parameter data stored in a memory device. For example, the ADC adjustment module may adjust one or more scale parameters based on the output of the power mode identification module 110. The telemetry module 108 may transmit telemetry electrical data to the processor. The telemetry electrical data may be based on the output of the electrical data module 104, and may include, for example, processor current and/or processor voltage.

In some examples, one or more of modules 102 in FIG. 1 can receive data from one or more circuits and can cause the computing device to perform one or more tasks. For example, and as will be described in greater detail below, one or more of modules 102 can be implemented in one or more computing devices, such as the devices illustrated in FIG. 2 (e.g., computing device 230 and/or server 202). One or more of modules 102 can also represent all or portions of one or more special-purpose computers configured to perform one or more tasks.

In some examples, example system 100 can include one or more circuits for performing one or more tasks. In this context, example circuits may include a power supply circuit and a processor current measurement circuit that may be part of an electrical data measurement circuit. Other example circuits may include an ADC adjustment circuit, a telemetry circuit, and a power mode identification circuit. In some examples, at least a portion of the respective circuit functionality may be provided by a software module, for example, as discussed above.

Example system 100 can also include one or more memory devices, such as memory 140. Memory 140 generally represents any type or form of volatile or non-volatile storage device or medium capable of storing data and/or computer-readable instructions. In one example, memory 140 can store, load, and/or maintain one or more of modules 102. Examples of memory 140 include, without limitation, Random Access Memory (RAM), Read Only Memory (ROM), flash memory, Hard Disk Drives (HDDs), Solid-State Drives (SSDs), optical disk drives, caches, variations or combinations of one or more of the same, or any other suitable storage memory.

Example system 100 can also include one or more physical processors, such as physical processor 130. Physical processor 130 generally represents any type or form of hardware-implemented processing unit capable of interpreting and/or executing computer-readable instructions. In one example, physical processor 130 can coordinate with one or more of modules 102 to facilitate controlling a voltage regulator. Examples of physical processor 130 include, without limitation, microprocessors, microcontrollers, Central Processing Units (CPUs), Field-Programmable Gate Arrays (FPGAs) that implement softcore processors, Application-Specific Integrated Circuits (ASICs), portions of one or more of the same, variations or combinations of one or more of the same, or any other suitable physical processor.

Example system 100 can also include one or more additional elements, such as a power supply including one or more voltage sources (such as a multi-phase power supply) and one or more voltage regulators, as discussed in more detail below. For example, additional elements 120 can include power supply components such as those described in more detail below. Examples of additional elements 120 include, without limitation, voltage sources, voltage regulators, and voltage regulators.

Example system 100 in FIG. 1 can be implemented in a variety of ways. For example, all or a portion of example system 100 can represent portions of example system including a server such as the system discussed below.

Figure 2:
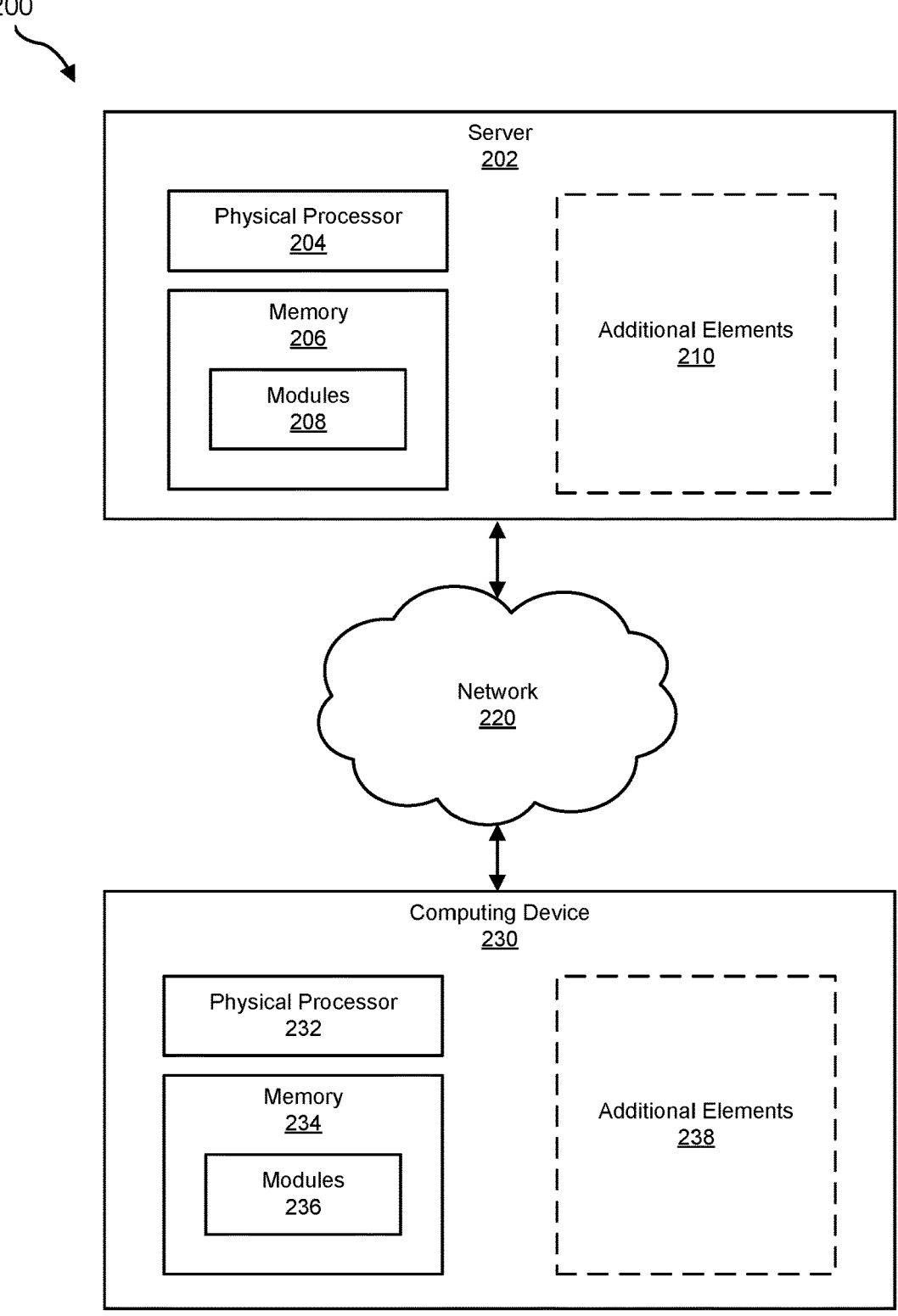
FIG. 2 is a block diagram of an additional example system that can include control of a voltage regulator, according to some examples.

FIG. 2 shows a system 200 that can include a computing device 230 in communication with a server 202 via a network 220. In some examples, all or a portion of a functionality of modules can be performed by computing device 230, server 202, and/or any other suitable computing system, for example, a system also attached to network 220. As will be described in greater detail below, one or more of modules 102 from FIG. 1 can, when executed by at least one processor of computing device 230 and/or server 202, enable computing device 230 and/or server 202.

Computing device 230 can represent any type or form of computing device capable of reading computer-executable instructions, and can be similar to system 100 discussed above in relation to FIG. 1. Computing device 230 can include at least one physical processor 232, memory 234 including modules 236, and additional elements 238. Additional examples of computing device 230 can include, without limitation, laptops, tablets, desktops, servers, cellular phones, Personal Digital Assistants (PDAs), multimedia players, embedded systems, wearable devices (e.g., smart watches, smart glasses, etc.), smart vehicles, Internet of Things devices (e.g., smart appliances, etc.), gaming consoles, variations or combinations of one or more of the same, or any other suitable computing device.

Additional examples of server 202 include, without limitation, storage servers, database servers, application servers, and/or web servers configured to run certain software applications and/or provide various storage, database, and/or web services. Although illustrated as a single entity in FIG. 2, server 202 can include and/or represent a plurality of servers that work and/or operate in conjunction with one another. Server 202 can include any type or form of computing device that is capable of communicating with one or more additional computing device. Server 202 can include at least one physical processor 204, memory 206 including modules 208, and additional elements 210.

In some examples, the function of the power mode identification module 110 in the computing device discussed above in relation to FIG. 1 can be performed by the server 202. For example, if the server 202 is streaming a video signal to the computing device 230, the server 202 can provide a signal through the network 220 to the computing device 230 indicating that the computing device is operating in a relatively low power mode. In some examples, the server can monitor the power consumption of the computing device and can receive data from a telemetry module within the computing device.

Network 220 generally represents any medium or architecture capable of facilitating communication or data transfer. In one example, network 220 can facilitate communication between the server 202 and the computing device 230. In some examples, network 220 can facilitate communication or data transfer using wireless and/or wired connections. Examples of network 220 include, without limitation, an intranet, a Wide Area Network (WAN), a Local Area Network (LAN), a Personal Area Network (PAN), the Internet, Power Line Communications (PLC), a cellular network (e.g., a Global System for Mobile Communications (GSM) network), portions of one or more of the same, variations or combinations of one or more of the same, or any other suitable network.

Additional elements 210 generally represents any type or form of server components. Examples of additional elements 210 include, without limitation, one or more voltage regulator controllers included within the server configuration.

Many other devices or subsystems can be connected to or included within system 100 in FIG. 1 and/or system 200 in FIG. 2. Conversely, all of the components and devices illustrated in FIGS. 1 and 2 need not be present to practice the implementations described and/or illustrated herein. The devices and subsystems referenced above can also be interconnected in different ways from that shown in FIG. 2. Systems 100 and 200 can also employ any number of software, firmware, and/or hardware configurations. For example, one or more of the example implementations disclosed herein can be encoded as a computer program (also referred to as computer software, software applications, computer-readable instructions, and/or computer control logic) on a computer-readable medium.

The term "computer-readable medium," as used herein, generally refers to any form of device, carrier, or medium capable of storing or carrying computer-readable instructions. Examples of computer-readable media include, without limitation, transmission-type media, such as carrier waves, and non-transitory-type media, such as magnetic-storage media (e.g., hard disk drives, tape drives, and floppy disks), optical-storage media (e.g., Compact Disks (CDs), Digital Video Disks (DVDs), and BLU-RAY disks), electronic-storage media (e.g., solid-state drives and flash media), and other distribution systems.

Figure 3:
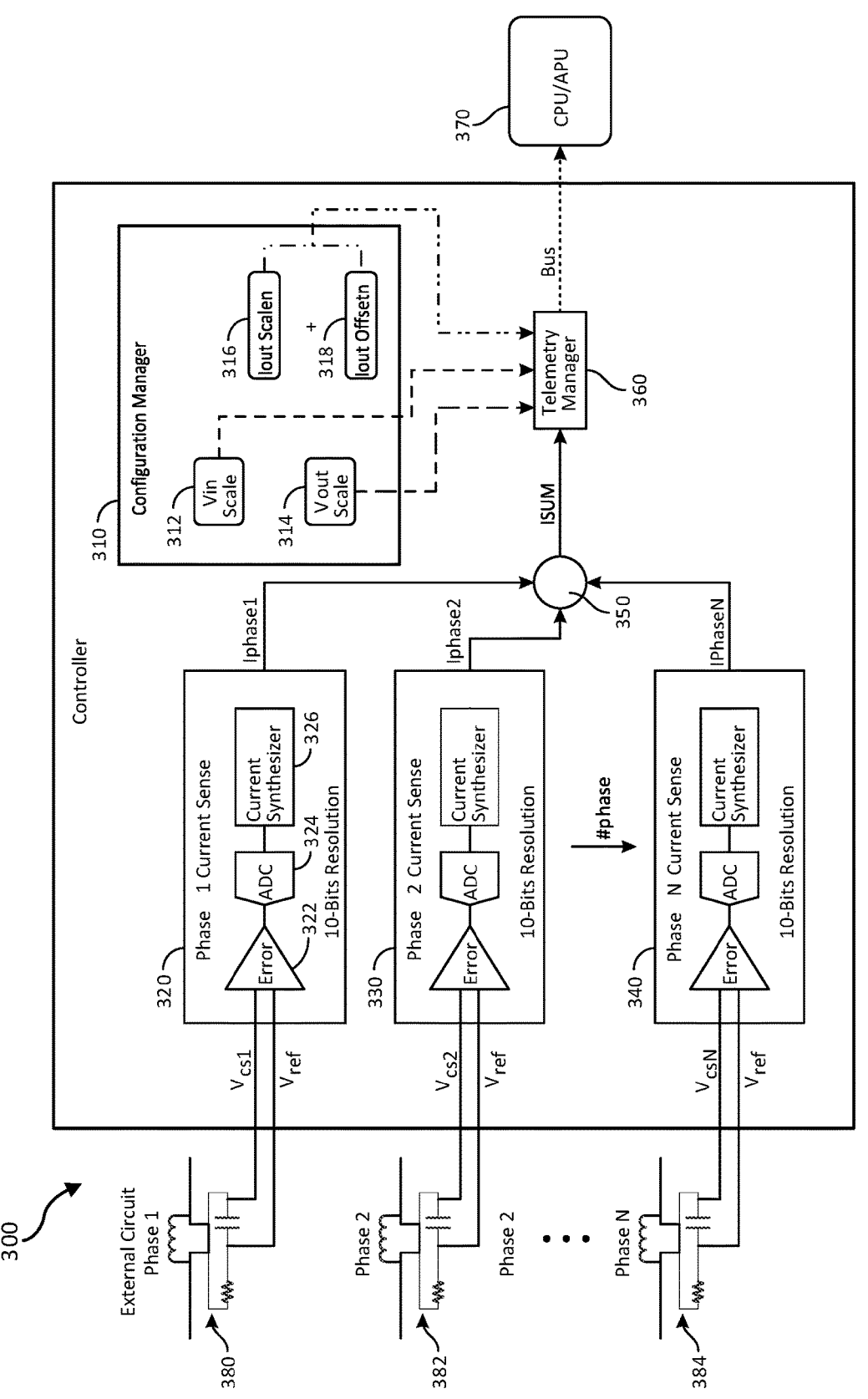
FIG. 3 is a block diagram of an example system including a voltage regulator controller, according to some examples.

FIG. 3 is a block diagram of an example system including a controller 300. In some examples, the controller 300 can include a voltage regulator (VR) controller. Controller 300 includes a configuration manager 310, a plurality of current sensors (including current sensor 320, current sensor 330, and current sensor 340), a current summer 350, and a telemetry manager 360. The telemetry manager can receive summed current data from the current summer 350 and provide telemetry data (e.g., including current and/or voltage data) to the processor 370.

Each current sensor can include an error detector, an ADC, and a current synthesizer. For example, current sensor 320 includes an error sensor 322, an ADC 324, and a current synthesizer 326. Each current sensor can receive data from an inductor, which may be a component of a voltage adjuster circuit (e.g., voltage adjuster circuit 380, voltage adjuster circuit 382 or voltage adjuster circuit 384). The data can include, for example, a voltage developed across a reference resistor or other component from which the current supplied to the processor and/or the processor power can be determined. In some examples, the ADC input voltage can be based on an electric potential across the reference resistor.

The configuration manager 310 provides scale data (e.g., input and/or output scale data) that can be used, for example, to adjust the current sensor configurations, for example, to adjust the input and/or output scale used by the ADC of each current sensor. Scale data can include an input voltage scale 312 (denoted Vin scale), an output voltage scale 314 (denoted Vout scale), an output current scale 316 (denoted Iout Scalen), and an output current offset 318 (denoted Iout Offsetn).

In some examples, the controller 300 can be configured so that the scale data can be adjusted based on the power consumption of the processor. For example, the ADC input range can be reduced for low power operation of the processor based on the lower current sensor signals that are processed by the respective ADC. A further example is described below.

Figure 4:
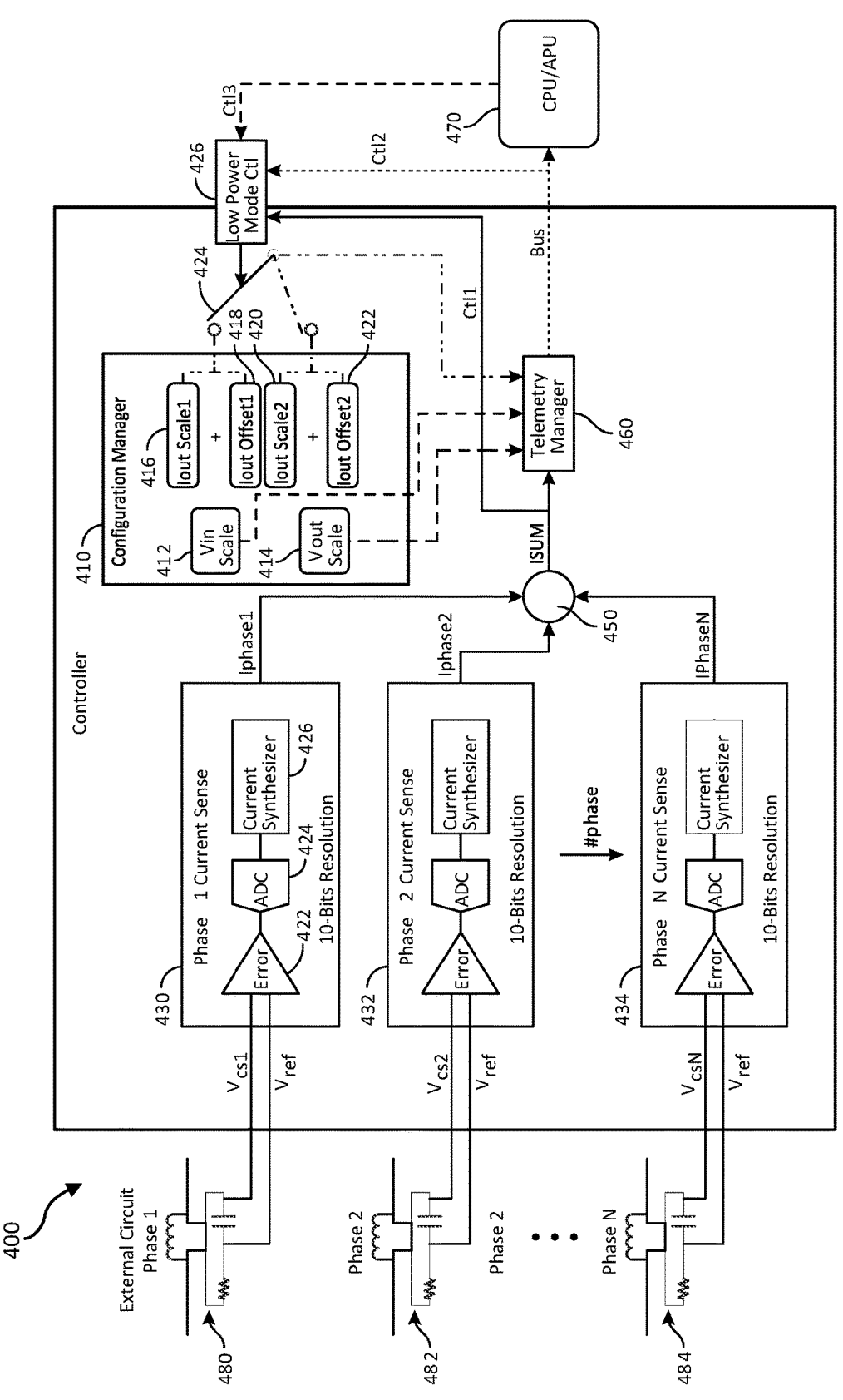
FIG. 4 is a block diagram of an example system including a voltage regulator controller, according to some examples.

FIG. 4 is a block diagram of an example system including a controller 400. Controller 400 can include similar components to controller 300 discussed above, including a configuration manager 410, a plurality of current sensors (including current sensor 430, current sensor 432, and current sensor 434), a current summer 450, and a telemetry manager 460. The telemetry manager can receive summed current data from the current summer 450 and provide telemetry data (e.g., including current and/or voltage data) to the processor 470. Each current sensor can include an error detector, an ADC and a current synthesizer, and can receive data from a voltage adjuster circuit, for example, as discussed above in relation to FIG. 3. The data can include, for example, a voltage dropped across a reference resistor or other component from which the current supplied to the processor can be determined. The error detectors can be used to remove or correct signals received by a current sensor from external circuits (e.g., external circuit 480, external circuit 482, or external circuit 484) in a manner similar to that discussed above in relation to FIG. 3.

The configuration manager 410 provides scale data (e.g., input and/or output scale data) that can be used, for example, to adjust the current sensor configurations, for example, to adjust the input and/or output scale used by the ADC of each current sensor. Scale data can include an input voltage scale 412 (denoted Vin scale), an output voltage scale 414 (denoted Vout scale), a first output current scale 416 (denoted Iout scale1), a first output current offset 418 (denoted Iout offset1), a second output current scale 420 (denoted Iout scale2) and a second output current offset 422 (denoted Iout offset2).

In some examples, the controller 400 can be configured to determine if the processor 470 is operating in a low power mode, for example. If the processor is operating in the low power mode, the second output current scale and second output current offset can be selected (schematically represented by switch 424) so that the scale data is adjusted based on the power consumption of the processor. For example, the ADC input range can be reduced in order to improve the telemetry resolution (e.g., for low power operation of the processor) based on the lower current sensor signals that are processed by the respective ADC. If the processor 470 is not operating in the low power mode, the first output current scale and first output current offset can be selected. In this context, selected can refer to retaining a previous scale factors, changing scale factors based on processor power, or other suitable response. The power mode of the processor can be communicated from the processor 470 to power mode controller 426, which can be used to select the scale factors based on the processor power mode (e.g., low or high power) or based on a determination (e.g., measurement or estimate) of the processor power.

Figure 5A:
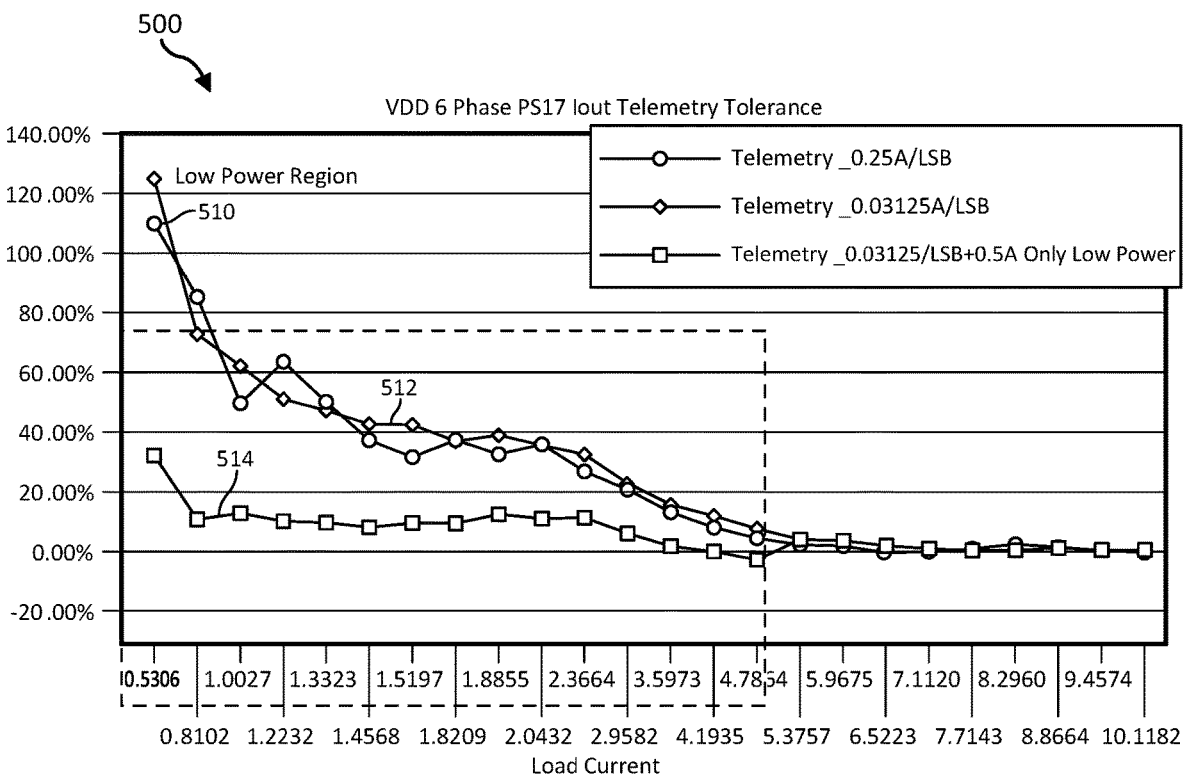
FIGS. 5A and 5B show improvements in telemetry data achieved in some examples.
Figure 5A:
Figure 5B:
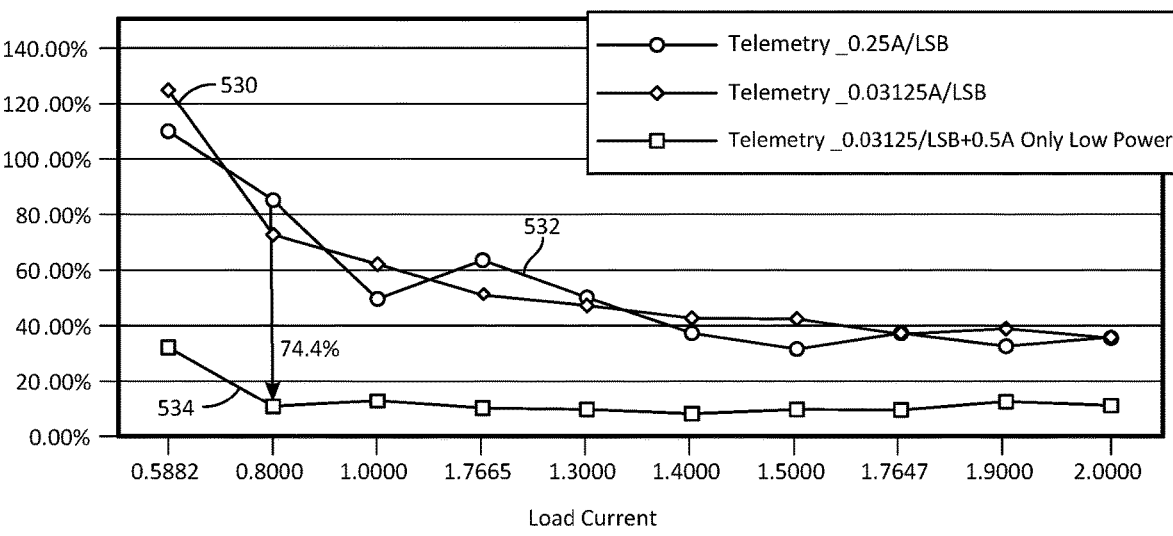

FIGS. 5A and 5B show improvements in telemetry data achieved in some examples.

FIG. 5A shows telemetry error (tolerance) as a percentage and as a function of load current. In the graph 500, an error closer to zero percent represents improved accuracy. The curve 510 corresponds to an ADC input setting of 0.25 A per least significant bit (0.25 A/LSB). This setting can allow the full range currents for all processor design powers to be sensed. However, the accuracy at low processor powers is reduced as variations in the reduced current can occur between neighboring LSBs without being detectable. Curve 512 corresponds to 0.03125 A/LSB. Curve 514 corresponds to 0.03125 A/LSB with a 0.5 A offset, leading to improved telemetry accuracy, particularly when the processor is operating with relatively low current consumption.

FIG. 5B is a detail of a portion of FIG. 5 corresponding to low power operation of the processor. In the graph 520, curve 530 represents a portion of curve 510, curve 532 represents a portion of curve 512, and curve 534 represents a portion of curve 514.

FIGS. 5A and 5B show improved telemetry accuracy for low power operation of the processor, including an offset applied to the ADC input range only at processor currents corresponding to low power operation of the processor.

Figure 6:
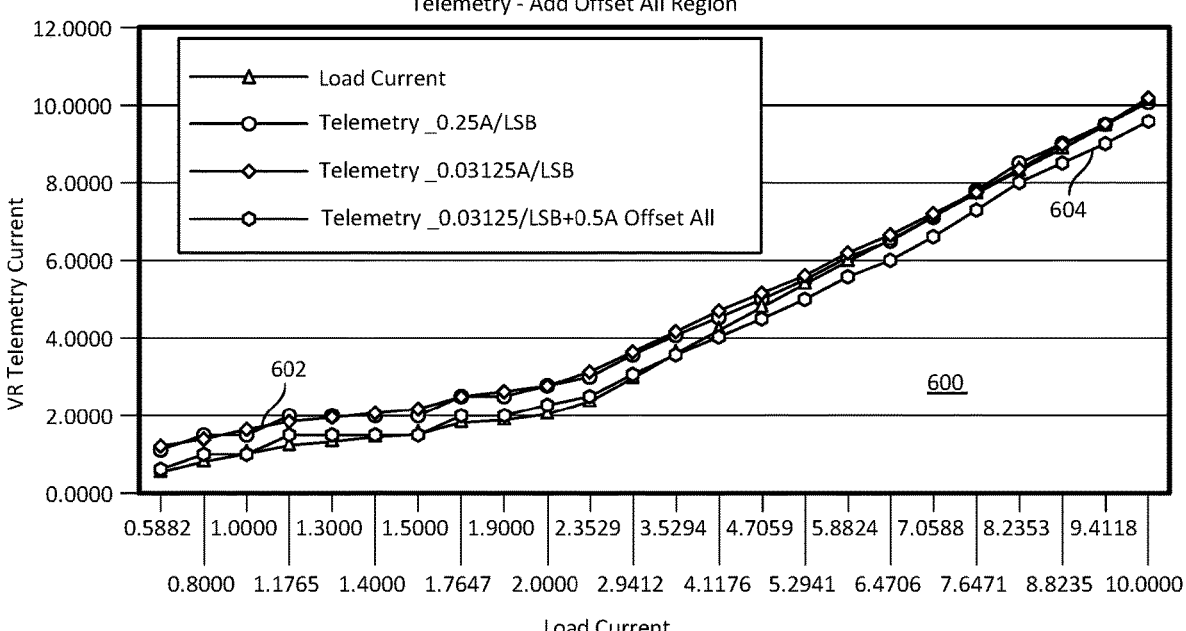
FIGS. 6 and 7 show improvements in telemetry data achieved in some examples.
Figure 7:
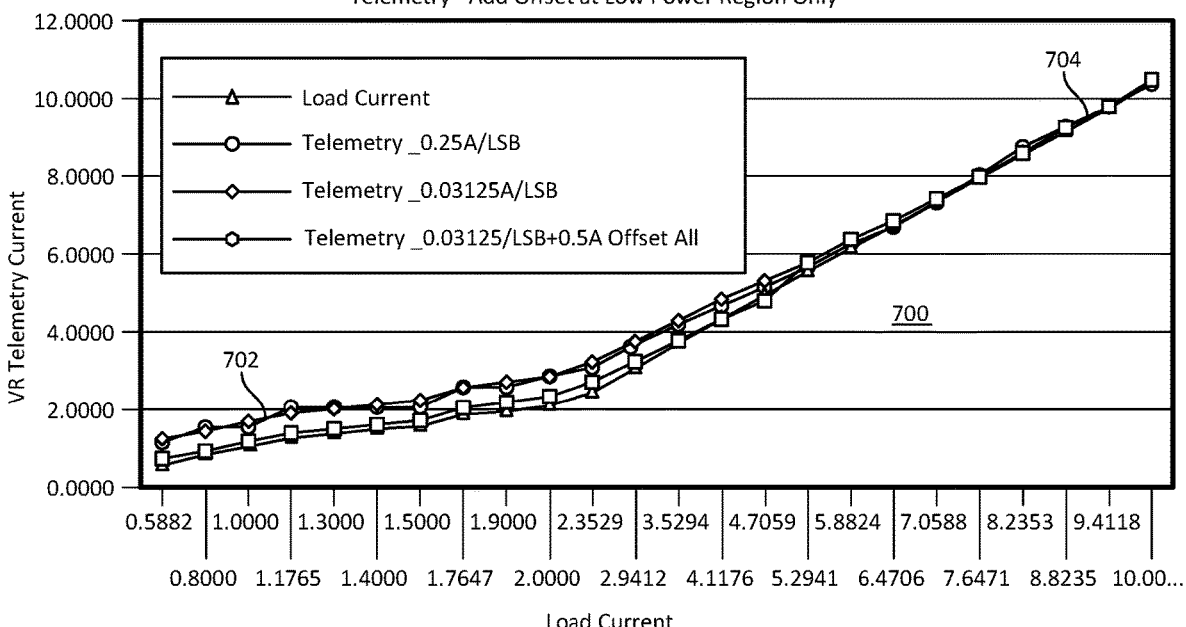

FIGS. 6 and 7 show improvements in telemetry data achieved in some examples.

FIG. 6 shows a graph 600 showing a number of curves including load current telemetry, telemetry using 0.25 A/LSB, telemetry using 0.03125 A/LSB, and telemetry using 0.03125 A/LSB with a 0.5 A offset for all processor current ranges. The graph shows lower power data 602 and higher power data 604.

FIG. 7 shows a graph 700 including number of curves such as voltage regulator telemetry, telemetry using 0.25 A/LSB, telemetry using 0.03125 A/LSB, and telemetry using 0.03125 A/LSB with an offset of 0.5 A applied only for low processor powers. In some examples, the offset can be applied over the low power region (e.g., up to 10%, 20%, 30%, 40% or up to 50% of the maximum power) and not at higher power ranges. Selective application of the offset can improve accuracy at higher processor powers (e.g., as shown at 704) while retaining accuracy improvements at lower processor powers (e.g., at low powers such as those corresponding to low power region 702).

In some examples, a VR controller can allow voltage or current telemetry modifications over the design power range of a processor while maintaining accuracy for relatively low power processor operation. For example, a processor such as an APUs can have an operational power range of 15 W to 80 W. The voltage regulator can have a current-voltage return function and can (in some examples, e.g., control of a VR for an APU) return the current, voltage and temperature of the processor to a master processor such as a CPU. For example, the voltage regulator can support up to 162 A current reporting, corresponding to a 0.25 A/LSB resolution. A processor such as an APU can operate in a relatively low power mode (which can also be termed a light load mode) where the current is relatively low, such as less than 1 A. The higher output current scale can allow insufficiently accurate current reporting for a current/LSB ratio that is suitable for high power operation. This can also degrade battery life assessment. Hence, it can be advantageous to reduce the current (A)/LSB ratio when the processor is operating in a relatively low power mode.

A voltage regulator controller can have an default ADC input scale defined at fabrication (e.g., either using data storage in a non-volatile memory (NVM) or a resistor selection). The default value can allow inputs to the ADC over the full design power range of the processor. The input ADC scale can be stored as default and/or initial ADC scale data in a register. The VR controller can read the ADC scale data from the register to determine the appropriate ADC input scale used to determine, for example, the processor current.

The initial or default ADC data can allow 10-bit resolution across the design current range, have no missing codes, and the maximum current sensing capability should cover the full design current range of the processor.

For lower processor powers (e.g., approximately equal to or less than 1 W, 500 mW, 250 mW, 100 mW, or 50 mW), average current can be less than that represented by the LSB of the ADC, reducing accuracy. For example, for a processor operating at a low power, the processor current can be less than that represented by an LSB of the ADC. For example, the ADC can have an initial current/LSB value of 0.25 A, and the average current in low power mode can be less than this value, such as between 0.1 A and 0.25 A. Variations in the processor current of as much a 50% possibly do not change the output of the ADC. In some examples, the input current sensitivity of the ADC (e.g., current per LSB) can be reduced when the processor is operating in a relatively low power mode. In some examples, the input current range of the ADC can be reduced (e.g., by at least 10%, such as at least 25%, such as at least 50%) when the average processor current (e.g., the time averaged processor current over a predetermined time period of, e.g., between 1 second and 10 seconds) becomes less than the threshold.

In some examples, the processor can receive current data from the VR controller over a bus. In some examples, the VR controller can adjust the ADC scale dynamically, for example, by performing a runtime change of an ADC scale parameter in response to processor power data.

In some examples, a processor can have a multiple phase power supply design, for example, a four phase current supply. Telemetry accuracy can be insufficient when the processor is operating at a relatively low power, as telemetry accuracy problems can be present for each the multiple phase supplies. The total current values for each phase can be reduced, compared to a single-phase supply for a given summed current, further reducing the telemetry accuracy. Some power supplies include a phase balance feature that can introduce further sources of error.

A processor can be determined to be in a low power mode if the low power operation exceeds a predetermined setting time duration. The output current of the ADC can be adjusted (e.g., by reducing the current/LSB value from a high value to a low value) to improve the ADC resolution. An offset can be added to the ADC scale to improve the current telemetry accuracy. If the processor detects a high-power request, the processor can send high power operation data to the VR controller, and the output current scale can be set back to a default value used for relatively high power performance mode. The increase in current/LSB resolution can lead to a higher error gap, particularly if the processor re-enters a low power mode.

In some examples, a VR controller can include a power mode control unit configured to adjust the ADC scale and offset selection to improve telemetry accuracy. A first control line (Ctl1 as illustrated above) can be controlled by VR controller, and the VR controller can select different scale using the summed current (ISUM data). If ISUM data indicates a low power operation, the scale data can be adjusted from default values to low power values. A second control line (Ctl2) can be controlled by the processor over a Bus (e.g., a SVI or PMBus), and the processor can adjust scale data (e.g., output current scale) based on data received over the second control line. In some examples, a VR controller can include third control line (Ctl3) that can convey a hardware signal from the processor that directly indicates that the processor is operating in a low power mode.

At device start-up, the output current scale can be set at a default setting, but then can be dynamically modified based on processor power. For example, the default output current scale can be set to another scale such as a low power scale, for example, based on a low power mode unit signal. The processor can read a default or modified register value to obtain scale data and use the scale data for telemetry calculation.

In some examples, the processor can modify stored scale data, for example, using a communication command. In some examples, the voltage regulator controller can determine the telemetry data using an ADC resolution (e.g., a current change corresponding to a change in the LSB) requested by the processor.

In some examples, the telemetry error can be from over 80% to approximately 10% at for a low processor current such as less than 1 A (e.g., 0.8 A) by adjusting the ADC resolution and using an optional added offset. The offset can reduce telemetry accuracy for higher currents, but this can be avoided by applying the offset only for low power processor operation.

In some examples, a VR controller can receive a signal (e.g., from the processor) that processor is operating in a low power mode. The current scale can be adjusted for low current operation. An offset can be applied only when the processor is operating in a low power mode.

Using values discussed above based on measurements, the telemetry error was reduced from 85% to 11% at 0.8 A. Using these values, the power saving is 0.6V×1.5 A minus 0.8V×0.83 A, or a reduction from 0.9 W to 0.66 W. For low power operation, the battery life can be improved by at least 30%, for example, by 33%.

Operation can include one or more of the following steps. The processor power consumption can be detected. If the processor is operating at low power for a predetermined time period, that implies that there was no high-performance request to the processor for this time period. The processor can send out a hardware signal indicating low power operation to the VR controller or other control unit. This can include sending a signal to the VR controller. In some examples, the VR controller can detect low power operation using current data, such as summed current data. The VR controller can select a low power scale (e.g., ADC scale such as a current/LSB value) based on the low power operation. The VR controller can report current and/or voltage values to the processor using the low power scale. If the processor receives a high power task request, the processor can send an exit signal to the VR controller and the scale can be reset to a default or initial value. In some examples, a processor can have a plurality of operational power modes (e.g., defined as a range of processor power operation) and each operational power mode can be associated with a respective scale values (e.g., respective values of current/LSB for the ADC). The system can perform continuous (e.g., at intervals less than a predetermined value such as 5 seconds) tracking of the processor power and adjust the scale values accordingly.

Example processes can be performed by one or more VR controllers and/or one or more processors. In some examples, some or all of the function of a multi-phase VR controller can be performed using a voltage converter circuit. Power thresholds are not limited to two levels (e.g., low power and high power). Any suitable number of operational power modes can be defined (e.g., by operational power ranges) and suitable scale data associated with each operational power mode. Operational power can be determined based on one or more of the processor power, total system power, processor current, or processor temperature measurement (e.g., core temperature measurement).

Figure 8:
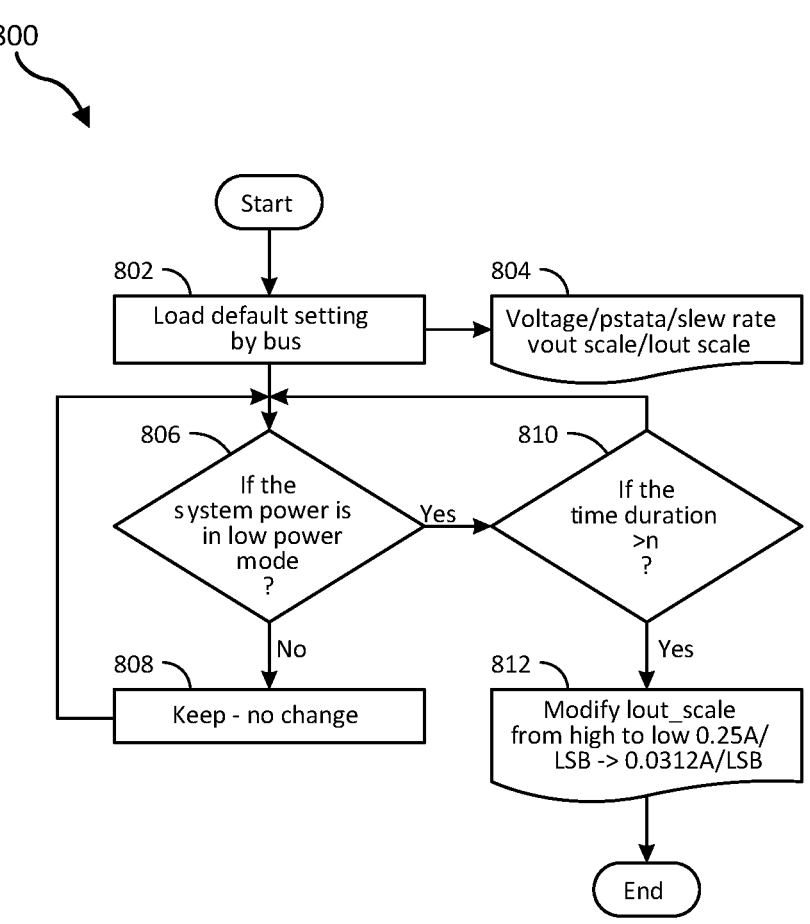
FIG. 8 shows a process for controlling a voltage regulator, according to some examples.
Figure 9:
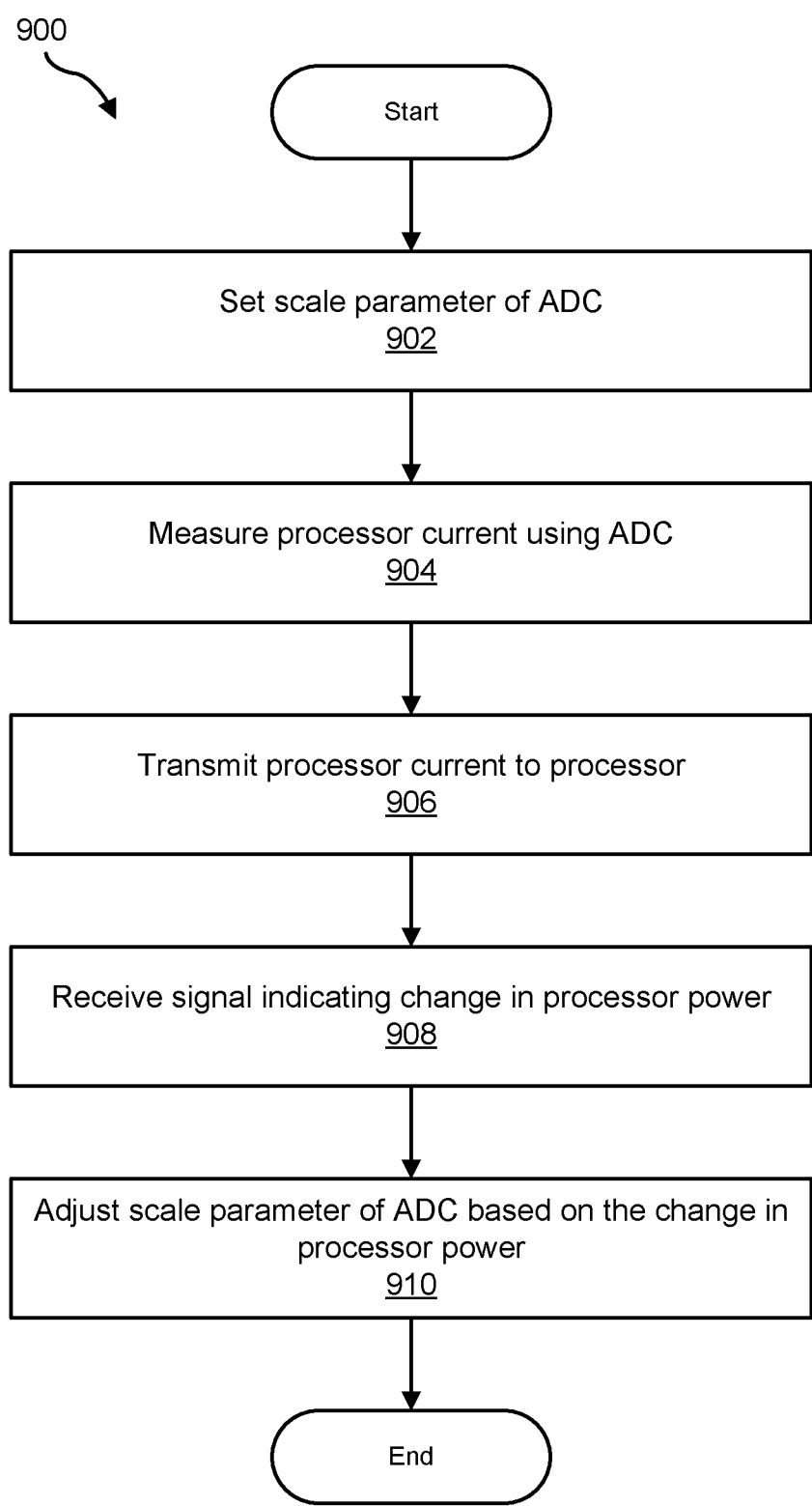
FIG. 9 shows a flow diagram of an example method.
Figure 10:
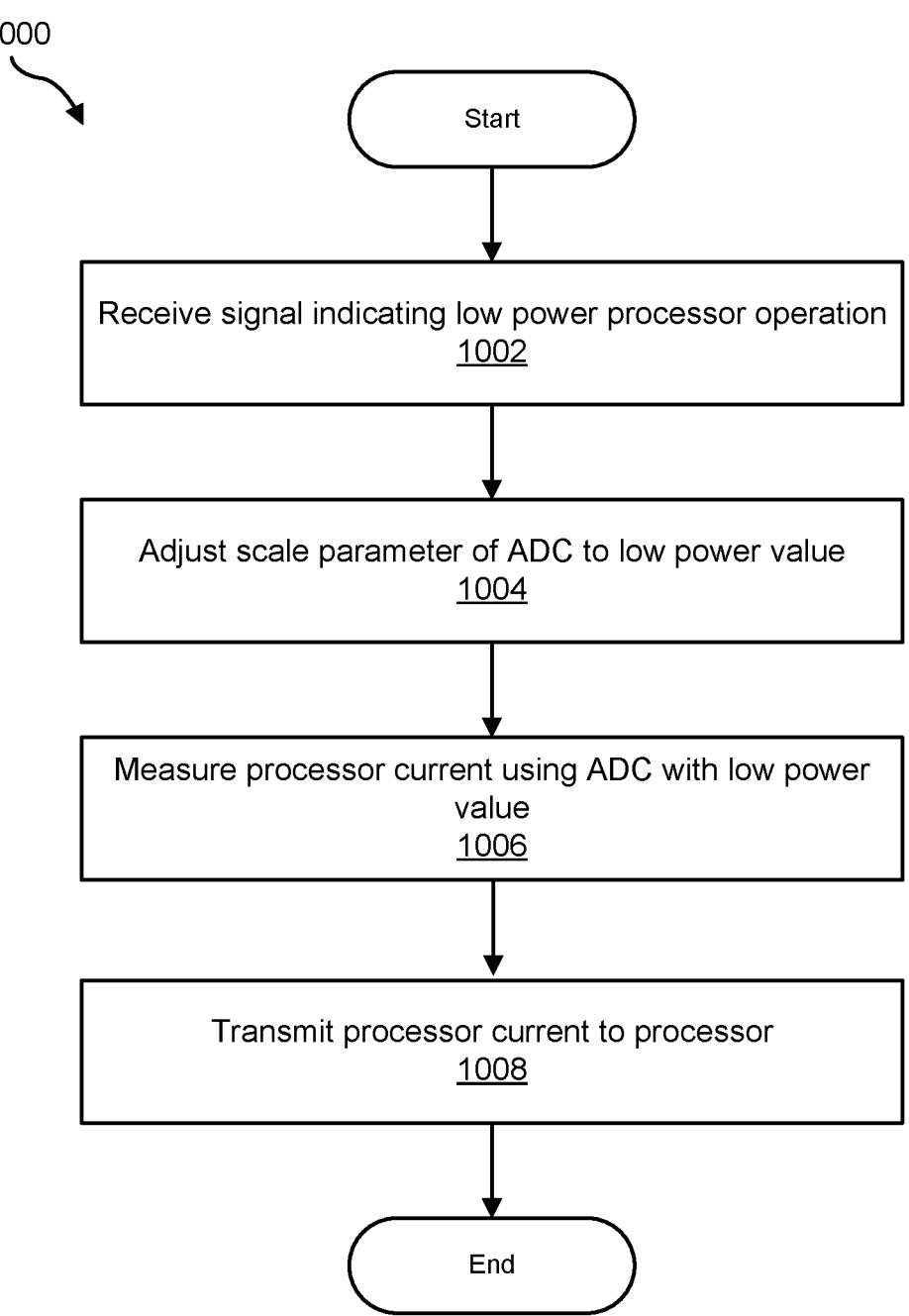
FIG. 10 shows a further flow diagram of an example method.

FIGS. 8-10 show flow diagrams of example computer-implemented methods for control of a voltage regulator. The steps shown in FIGS. 8-11 can be performed by any suitable circuit, device, and/or computing system described above, such as system 100 in FIG. 1, other variations or combinations of systems discussed herein or other suitable system. In some examples, one or more of the steps shown in FIGS. 8-11 can represent an algorithm whose structure includes and/or is represented by multiple sub-steps, examples of which will be provided in greater detail below.

FIG. 8 shows an example process 800 for controlling a voltage regulator. The example process can include loading default settings including scale factors (802), for example, over a bus connection between the processor and the controller; storing settings (804) such as voltage, power settings, slew rate, and scale factors such as the output voltage scale, and/or the output current scale. The default parameters can be configured to high power mode, but this is not limiting and other power modes can be used as the default parameters. The process can further include determining if the processor is in a low power mode (806); if so, determining if the processor is in the low power mode for longer than a predetermined time (810); and, if so, changing the scale parameters to optimize current detection accuracy for the low power mode (812). However, if the processor was not in the low power mode, then the scale parameters can remain unchanged (808).

FIGS. 9-10 show flow diagrams of further example methods, for example, methods of controlling a voltage regulator.

FIG. 9 shows an example method 900 for controlling a voltage regulator. The example method includes setting a scale parameter of an analog-to-digital converter (ADC) (902), measuring a processor current of a processor using the ADC (904), transmitting the processor current to the processor (906), receiving a signal indicating a change in operational power of the processor (908), and adjusting the scale parameter of the analog-to-digital converter based on the change in operational power of a processor (910). An example method can further include measuring a second processor current of a processor using the ADC and the adjusted scale parameter, and transmitting the second processor current to the processor.

FIG. 10 shows a further example method 1000 for controlling a voltage regulator. The example method includes receiving a signal indicating low power operation of a processor (1002), adjusting the scale parameter of an analog-to-digital converter (ADC) to a low power scale parameter (1004), measuring a processor current of the processor using the ADC using the low power scale parameter (1006), and transmitting the processor current to the processor (1008). An example method can further include receiving a signal indicating a change in operational power of the processor (e.g., to a high power mode) and adjusting the scale parameter of the analog-to-digital converter based on the change in operational power of a processor. An example method can further include measuring a second processor current of a processor using the ADC and the adjusted input parameters, and transmitting the second processor current to the processor.

In some examples, methods steps can be performed by one or more of the systems described herein, such as the apparatus described above in relation to FIGS. 1 and 2. In some examples, an example method can be encoded as computer-readable instructions on a non-transitory computer-readable medium. For example, a non-transitory computer-readable medium can include one or more computer-executable instructions that, when executed by at least one processor of a computing device, can cause the computing device to perform a method such as described herein.

The power requirements of one or more processors can vary during computer operation, for example, according to the processes performed by one or more processors. Power requirements can range, for example, from 15 W to 80 W though this any other ranges described herein can be approximate and not limiting. In some examples, a voltage regulator (VR) can be used to adjust the voltage and current supplied to the processor and also to return current, voltage and temperature data to the processor (referred to as telemetry).

An example VR controller can include or be in electrical communication with a reference resistor. In some examples, a VR controller can include an ADC (analog-to-digital converter) to determine the current supplied to the processor. The VR controller can support current reporting up to at least the maximum design current of the processor. For example, the ADC input can have 10 bits resolution and a current resolution of, for example, 0.25 A per least significant bit (0.25 A/LSB). However, a processor can operate in a low power mode for significant periods of time during which the current is relatively small (e.g., less than 1 A) and the ADC resolution becomes a larger fraction of the actual current. This can result in low accuracy current determination and telemetry. An improved VR controller can operate as follows. During start-up, the computer can set the current scale register. The VR controller reads the current scale register to determine an appropriate decoding scale. The ADC can maintain 10-bit resolution across all current scales and have no missing codes. The VR controller can adjust the offset and input range (and hence current resolution) of the ADC based on the processor power. For example, when the processor is in a low power mode, the ADC range can be reduced, improving the current resolution. The telemetry accuracy is hence improved in low power mode. If the processor returns to a high power mode, the ADC range can be increased.

In some examples, an apparatus can include a processor, a voltage regulator configured to provide a processor voltage to the processor, a voltage regulator controller comprising a current sensor comprising an analog-to-digital converter (ADC) having an ADC input range and configured to provide current data based on an ADC input voltage, and a configuration manager configured to receive processor power data and adjust the ADC input range based on the processor power data. The voltage regulator controller can further include a telemetry manager configured to receive the current data from the ADC and to transmit current and/or voltage data to the processor.

In some examples, the configuration manager can be configured to receive processor power data from the processor. The ADC can have an ADC input range offset and the configuration manager can be configured to adjust the ADC input range offset based on the processor power data. The ADC can have an ADC input represented by between 8 and 12 bits. The ADC can have an ADC input range offset and the configuration manager can be configured to adjust the ADC input range offset based on the processor power data.

In some examples, the processor can have a low power mode and a high power mode, the ADC input range has a lower value when the processor operates in the low power mode, and the ADC input range has a higher value when the processor operates in the high power mode. In some examples, the processor can have a plurality of operational modes including a low power mode and a high power mode, and the processor power data includes a low power indication when the processor operates in the low power mode. A least significant bit of the ADC can represent a detected voltage of less than 0.2 V (e.g., less than 0.1 V) when the processor operates in the low power mode; and the least significant bit of the ADC can represent a voltage of greater than 0.2 V when the processor operates in the high power mode.

In some examples, the voltage regulator controller can improve the power telemetry accuracy of the apparatus by at least 30% when the processor is in the low power mode. In some examples, the voltage regulator controller can improve a power efficiency of the apparatus, particularly when the processor is in a low power mode. The apparatus can be or include a computer device, and the processor can be a central processor unit (CPU), a graphics processor unit (GPU), or an accelerated processor unit (APU). In some examples, the processor can have a multiphase power supply, the voltage regulator can include a plurality of phase current sensors, each phase current sensor of the plurality of phase current sensors can include a respective ADC providing a phase current to a current summer, and the current summer provides a summed current to the telemetry manager.

In some examples, a VR controller can allow dynamic adjustment of the ADC range based on processor power. In some examples, the VR controller can receive a power status signal from the processor (e.g., when the processor is in a low power mode) and adjust the ADC range based on the power status signal. Hence, an improved apparatus can include a processor and a VR controller. The VR controller can include at least one ADC and can receive processor current data based on one or more current supplies to the processor. The VR controller can dynamically adjust the input range and hence resolution of the ADC based on the power consumption of the processor. This may allow an improvement in the power efficiency of the apparatus, for example, approximately equal to or greater than a 20% improvement, for example, approximately equal to or greater than a 30% improvement. The processor can be a CPU (central processor unit), GPU (graphics processor unit), APU (accelerated processor unit) or other processor.

While the foregoing disclosure sets forth various implementations using specific block diagrams, flowcharts, and examples, each block diagram component, flowchart step, operation, and/or component described and/or illustrated herein can be implemented, individually and/or collectively, using a wide range of hardware, software, or firmware (or any combination thereof) configurations. In addition, any disclosure of components contained within other components should be considered example in nature since many other architectures can be implemented to achieve the same functionality.

In some examples, all or a portion of example system 100 in FIG. 1 can represent portions of a cloud-computing or network-based environment. Cloud-computing environments can provide various services and applications via the Internet. These cloud-based services (e.g., software as a service, platform as a service, infrastructure as a service, etc.) can be accessible through a web browser or other remote interface. Various functions described herein can be provided through a remote desktop environment or any other cloud-based computing environment.

In various implementations, all or a portion of example system 100 in FIG. 1 can facilitate multi-tenancy within a cloud-based computing environment. In other words, the modules described herein can configure a computing system (e.g., a server) to facilitate multi-tenancy for one or more of the functions described herein. For example, one or more of the modules described herein can program a server to enable two or more clients (e.g., customers) to share an application that is running on the server. A server programmed in this manner can share an application, operating system, processing system, and/or storage system among multiple customers (i.e., tenants). One or more of the modules described herein can also partition data and/or configuration information of a multi-tenant application for each customer such that one customer cannot access data and/or configuration information of another customer.

According to various implementations, all or a portion of example system 100 in FIG. 1 can be implemented within a virtual environment. For example, the modules and/or data described herein can reside and/or execute within a virtual machine. As used herein, the term "virtual machine" generally refers to any operating system environment that is abstracted from computing hardware by a virtual machine manager (e.g., a hypervisor).

In some examples, all or a portion of example system 100 in FIG. 1 can represent portions of a mobile computing environment. Mobile computing environments can be implemented by a wide range of mobile computing devices, including mobile phones, tablet computers, e-book readers, personal digital assistants, wearable computing devices (e.g., computing devices with a head-mounted display, smartwatches, etc.), variations or combinations of one or more of the same, or any other suitable mobile computing devices. In some examples, mobile computing environments can have one or more distinct features, including, for example, reliance on battery power, presenting only one foreground application at any given time, remote management features, touchscreen features, location and movement data (e.g., provided by Global Positioning Systems, gyroscopes, accelerometers, etc.), restricted platforms that restrict modifications to system-level configurations and/or that limit the ability of third-party software to inspect the behavior of other applications, controls to restrict the installation of applications (e.g., to only originate from approved application stores), etc. Various functions described herein can be provided for a mobile computing environment and/or can interact with a mobile computing environment.

The process parameters and sequence of steps described and/or illustrated herein are given by way of example only and can be varied as desired. For example, while the steps illustrated and/or described herein can be shown or discussed in a particular order, these steps do not necessarily need to be performed in the order illustrated or discussed. The various example methods described and/or illustrated herein can also omit one or more of the steps described or illustrated herein or include additional steps in addition to those disclosed.

While various implementations have been described and/or illustrated herein in the context of fully functional computing systems, one or more of these example implementations can be distributed as a program product in a variety of forms, regardless of the particular type of computer-readable media used to actually carry out the distribution. The implementations disclosed herein can also be implemented using modules that perform certain tasks. These modules can include script, batch, or other executable files that can be stored on a computer-readable storage medium (e.g., a non-transitory computer-readable storage medium) or in a computing system. In some implementations, these modules can configure a computing system to perform one or more of the example implementations disclosed herein.

The preceding description has been provided to enable others skilled in the art to best utilize various aspects of the example implementations disclosed herein. This example description is not intended to be exhaustive or to be limited to any precise form disclosed. Many modifications and variations are possible without departing from the spirit and scope of the present disclosure. The implementations disclosed herein should be considered in all respects illustrative and not restrictive. Reference should be made to the appended claims and their equivalents in determining the scope of the present disclosure.

Unless otherwise noted, the terms "connected to" and "coupled to" (and their derivatives), as used in the specification and claims, are to be construed as permitting both direct and indirect (i.e., via other elements or components) connection. In addition, the terms "a" or "an," as used in the specification and claims, are to be construed as meaning "at least one of." Finally, for ease of use, the terms "including" and "having" (and their derivatives), as used in the specification and claims, are interchangeable with and have the same meaning as the word "comprising."

What is claimed is:

1. An apparatus comprising:
a processor;
a voltage regulator configured to supply power to the processor; and
a voltage regulator controller comprising:
  a current sensor comprising an analog-to-digital converter (ADC) having an ADC input range and configured to provide current data based on an ADC input voltage; and
  a configuration manager configured to receive processor power data and adjust a scale and/or an offset of the ADC input range based on the processor power data.

2. The apparatus of claim 1, wherein:
the ADC has an ADC input range offset:
the configuration manager is configured to adjust the offset of the ADC input range by adjusting the ADC input range offset.

3. The apparatus of claim 1, wherein the voltage regulator controller further comprises:
a telemetry manager configured to receive power data from the ADC and to transmit the power data to the processor.

4. The apparatus of claim 3, wherein the configuration manager is configured to adjust a telemetry offset based on the power data.

5. The apparatus of claim 1, further comprising a reference resistor, wherein:
the ADC input voltage is based on an electric potential across the reference resistor.

6. The apparatus of claim 1, wherein the configuration manager is configured to receive the processor power data from the processor.

7. The apparatus of claim 1, wherein:
the processor has a low power mode and a high power mode;
the ADC input range has a lower value when the processor operates in the low power mode; and
the ADC input range has a higher value when the processor operates in the high power mode.

8. The apparatus of claim 1, wherein:
the processor has a plurality of operational states including a low power mode and a high power mode; and
the processor power data includes a low power indication when the processor operates in the low power mode.

9. The apparatus of claim 8, wherein:
a least significant bit of the ADC represents a first voltage when the processor operates in the low power mode;

the least significant bit of the ADC represents a second voltage when the processor operates in the high power mode; and
the second voltage is greater than the first voltage.

10. The apparatus of claim 9, wherein the second voltage is at least 50% greater than the first voltage.

11. The apparatus of claim 8, wherein the voltage regulator controller improves a power efficiency of the apparatus when the processor is in the low power mode.

12. The apparatus of claim 1, wherein the processor is a central processor unit (CPU), a graphics processor unit (GPU), or an accelerated processor unit (APU).

13. The apparatus of claim 1, wherein the apparatus is a computer device.

14. The apparatus of claim 1, wherein:
the processor has a multiphase power supply:
the voltage regulator comprises a plurality of phase current sensors;
each phase current sensor of the plurality of phase current sensors comprises a respective ADC providing a phase current to a current summer; and
the current summer provides a summed current value.

15. A computer-implemented method for controlling a voltage regulator, at least a portion of the computer-implemented method being performed by a device comprising at least one processor, the computer-implemented method comprising:
setting a scale parameter for an analog-to-digital converter (ADC) to an initial scale parameter;
measuring a processor current for a processor using the ADC;
transmitting a processor power to the processor;
receiving a processor power signal indicating a change in the processor power; and
adjusting the scale parameter to a second scale parameter based on the change in the processor power.

16. The computer-implemented method of claim 15, further comprising:
measuring a second processor current using the ADC and the second scale parameter; and
transmitting a second processor power to the processor.

17. The computer-implemented method of claim 15, wherein:
the initial scale parameter is an initial current per least significant bit of the ADC; and
the second scale parameter is a second current per least significant bit of the ADC.

18. The computer-implemented method of claim 15, wherein:
the processor power signal indicating the change in the processor power indicates a low power operation of the processor.

19. A non-transitory computer-readable medium comprising one or more computer-executable instructions that, when executed by a computing device, cause the computing device to:
receive a signal indicating low power operation of a processor;
adjust a scale parameter of an analog-to-digital converter (ADC) to a low power scale parameter;
measure processor current data using the ADC based on the low power scale parameter; and
transmit processor power data to the processor.

20. The non-transitory computer-readable medium of claim 19, wherein the one or more computer-executable instructions that, when executed by the computing device, further cause the computing device to:

receive a signal indicating a change in an operational power of the processor; and adjust the scale parameter of the analog-to-digital converter based on the change in the operational power of the processor.

* * * * *